United States Patent [19]

Haluska et al.

[11] Patent Number: 5,492,958
[45] Date of Patent: Feb. 20, 1996

[54] METAL CONTAINING CERAMIC COATINGS

[75] Inventors: Loren A. Haluska; Keith W. Michael, both of Midland, Mich.

[73] Assignee: Dow Corning Corporation, Midland, Mich.

[21] Appl. No.: 403,024

[22] Filed: Mar. 13, 1995

Related U.S. Application Data

[63] Continuation of Ser. No. 221,594, Apr. 1, 1994, abandoned, which is a continuation-in-part of Ser. No. 28,063, Mar. 8, 1993.

[51] Int. Cl.$^6$ ..................................................... C08K 3/08
[52] U.S. Cl. ...................... 524/439; 524/432; 524/440; 524/441; 427/228; 427/235; 427/238; 427/387; 428/698; 428/702
[58] Field of Search .................................. 428/698, 702; 427/228, 235, 238, 387; 524/431, 432, 439, 440, 441

[56] References Cited

U.S. PATENT DOCUMENTS 3,986,997 10/1976 Clark .
4,756,977 7/1988 Haluska et al. .
4,808,653 2/1989 Haluska et al. .......................... 524/398
5,063,267 11/1991 Hanneman et al. ...................... 524/366
5,100,503 3/1992 Allman et al. .
5,258,334 11/1993 Lantz, II .
5,387,480 2/1995 Haluska et al. ............................ 528/15
5,399,441 3/1995 Bearinger et al. ...................... 428/689

FOREIGN PATENT DOCUMENTS 4-10339 1/1992 Japan .

OTHER PUBLICATIONS

The Merk Index Merk & Co. Inc. Rahway, N.J. pp. 3956–3957 (1976).

*Primary Examiner*—Melvyn I. Marquis
*Attorney, Agent, or Firm*—Roger E. Gobrogge

[57] ABSTRACT

Disclosed is a method of forming metal containing ceramic coatings on substrates. The method comprises applying a coating of hydrogen silsesquioxane resin and a metallic filler onto a substrate and heating the coated substrate at a temperature sufficient to convert the hydrogen silsesquioxane resin to a silica containing ceramic matrix containing the metallic filler.

19 Claims, No Drawings

METAL CONTAINING CERAMIC COATINGS

This is a continuation of application Ser. No. 08/221,594, filed on 4/01/94, now abandoned, which is a C-I-P of Ser. No. 08/028,063 filed Mar. 8, 1993.

BACKGROUND OF THE INVENTION

The present invention relates to ceramic, metal containing coatings formed from hydrogen silsesquioxane resin and metallic fillers. These coatings are useful, for example, in the manufacture of microelectronic devices.

The use of hydrogen silsesquioxane derived ceramic coatings on substrates such as electronic devices is known in the art. For instance, Haluska et al. in U.S. Pat. No. 4,756,977 disclose a process for forming a silica coating on an electronic substrate wherein a solution of hydrogen silsesquioxane resin is applied to a substrate followed by heating the coated substrate in air at a temperature in the range of 200°–1000° C. This reference, however, does not describe the use of metallic fillers within the coating.

Similarly, the use of fillers within ceramic coatings is also known in the art. For instance, U.S. Pat. No. 3,986,997 describes a composition comprising an acidic dispersion of colloidal silica and hydroxylated silsesquioxane in an alcohol-water medium which can be used to apply transparent abrasion resistant coatings on a variety of substrates. The reference, however, does not describe the use of hydrogen silsesquioxane nor the use of metallic fillers on electronic substrates.

The use of metallic fillers in ceramic coatings derived from silicates is also known in the art. This art, however, does not teach the use of hydrogen silsesquioxane resin to form the ceramic coatings.

The present inventors have now discovered that metal containing ceramic coatings can be formed from compositions comprising hydrogen silsesquioxane resin and metallic fillers.

SUMMARY OF THE INVENTION

The present invention relates to a method of forming a metal containing ceramic coating on a substrate and the substrate coated thereby. The method comprises first applying a composition comprising hydrogen silsesquioxane resin and a metallic filler onto the substrate. The composition on coated substrate is then converted to a metal containing ceramic coating.

The present invention also relates to a coating composition comprising hydrogen silsesquioxane resin and a metallic filler diluted in a solvent.

DETAILED DESCRIPTION OF THE INVENTION

The present invention is based on the discovery that metal containing ceramic coatings can be formed from compositions comprising hydrogen silsesquioxane resin and metallic fillers. Such metallic fillers can provide a number of desirable characteristics to the coatings. For instance, magnetic fillers can be added to the coating to produce a magnetic coating which may be useful in the manufacture of magnetic recording media. Similarly, electrically conductive fillers can be added to the coating to produce an electrically conductive coating which may be useful in the manufacture of electronic devices. Finally, metallic fillers also render the coatings thermally conductive.

Hydrogen silsesquioxane resin is advantageous in the formation of these ceramic-metallic coatings in that it does not contain carbon. Such carbon content in these coatings is detrimental to stable and predictable electromagnetic properties. While carbon may be "burned-out" of alternative coatings, it requires elevated temperatures (eg., 1200° C.) which can destroy the underlying substrate. Similarly, hydrogen silsesquioxane resin is also advantageous in this application in that its Si-H content can help prevent oxidation of the metals. This, too, can lead to more stable and predictable properties.

As used in the present invention, the expression "ceramic coating" is used to describe the hard coating obtained after heating the hydrogen silsesquioxane—metallic filler composition. This coating contains both amorphous silica ($SiO_2$) materials as well as amorphous silica-like materials that are not fully free of residual carbon, silanol (Si-OH) and/or hydrogen (which are obtained upon heating the hydrogen silsesquioxane) and the metallic filler materials. The expression "metallic filler" is used to describe the finely divided metallic solid phase which is distributed within the resin and the final ceramic coating. The expression "electronic substrate" is meant to include, but is not limited to, electronic devices or electronic circuits such as silicon based devices, gallium arsenide based devices, focal plane arrays, optoelectronic devices, photovoltaic cells and optical devices. The expression "magnetic coating" is used to describe coatings which are magnetized by a magnetic field (have a net magnetic moment). The expression "conductive coating" is used to describe coatings which are either electrically or thermally conductive.

In the process of the present invention a metal containing ceramic coating is formed on a substrate by a process which comprises applying a coating composition comprising hydrogen silsesquioxane resin and a metallic filler onto the substrate and then heating the coated substrate at a temperature sufficient to convert the hydrogen silsesquioxane to a silica-containing ceramic matrix which contains the metal.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed ($(HSiO_{3/2})_n$) or they may be only partially hydrolyzed (i.e., containing some Si-OR) and/or partially condensed (i.e., containing some Si-OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or Copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The fillers used herein are known in the art for use in coatings with other polymers. These included various inorganic and organic fillers, especially inorganic fillers, in a variety of morphologies including, but not limited to powders, particles, filaments, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, titanates such as potassium titanate and barium titanate, niobates such as lithium niobate and lead niobate, barium sulfate, calcium carbonate, precipitated diatomite, aluminum silicate or other silicates, pigments, phosphors, metals such as silver, aluminum and copper, wollostonite, mica, kaolin, clay, talc and the like. Also, some organic materials such as cellulose, polyamides, phenol resins and the like may be used.

In one preferred embodiment of the invention, the fillers are magnetic materials which produce magnetic coatings. These include carbon alloys, ferrites, iron carbonyls and alloys of metals such as iron, manganese, cobalt, nickel, copper, titanium, tungsten, vanadium, molybdenum, magnesium, aluminum, chromium, zirconium, lead, silicon and zinc. Examples include $Fe_2O_3$, MnZn, NiZn, CuZn, other ferrite materials and the like.

In another preferred embodiment of the invention, the fillers are metals which produce conductive coatings. These include metals such as gold, silver, copper, aluminum, nickel, zinc, chromium, cobalt and the like.

The particle size and shape of the above fillers can vary over a wide range depending on factors such as the type of filler, the desired coating thickness, etc.

The amount of metallic filler used in the present invention can also be varied over a wide range depending, for example, on the characteristics desired in the final coating. Generally, however, the metallic fillers are used in an amount less than about 90 weight percent of the coating to insure that enough resin is present to bind the metallic filler. Obviously, smaller amounts of metallic fillers (eg., 1–5 wt %) can also be used. A preferred amount of metallic filler is in the range of about 5 to about 80 wt. percent of the coating.

If desired, other materials may also be present in the coating composition. For instance, it is within the scope of the present invention to use a material which modifies the surface of the metallic filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents such as cellulose, clay, fumed silica, stearates and the like in the coating composition. These and other optional components are known to those skilled in the art.

According to the process of the invention, the hydrogen silsesquioxane resin, metallic filler and any optional components are applied to the surface of a substrate. Such substrates are well known to those skilled in the art (eg., electronics art).

The coating according to the present invention can be applied in any manner, but a preferred method involves dissolving the hydrogen silsesquioxane resin in a solvent and dispersing the metallic filler and any optional components therein. This dispersion is then applied to the surface of the substrate. Various facilitating measures such as stirring and/or heating may be used to dissolve or disperse the hydrogen silsesquioxane resin and metallic filler and create a more uniform application material. Solvents which may be used include any agent or mixture of agents which will dissolve or disperse the hydrogen silsesquioxane resin and metallic filler to form a liquid mixture without affecting the resultant coating. These solvents can include, for example, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the hydrogen silsesquioxane resin, metallic filler, solvent, and, any optional components is then coated onto the substrate. The method of coating can be, but is not limited to, spin coating, dip coating, spray coating or flow coating. Other equivalent means, such as silk-screening for selective deposition (eg., for traces), however, are also deemed to be within the scope of this invention.

The solvent is then allowed to evaporate from the coated substrate resulting in the deposition of the hydrogen silsesquioxane resin and metallic filler coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means (eg., melt coating) would also function herein and are contemplated to be within the scope of this invention.

The hydrogen silsesquioxane resin and metallic filler coating is then typically converted to a silica-containing ceramic matrix having the metallic filler dispersed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°–425° C. Heating is generally conducted for a time sufficient to ceramify, generally up to about 6 hours, with less than about 3 hours being preferred. Other conversion techniques such as radiation may also be used herein.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 microns). These coatings smooth the irregular surfaces of various substrates, they are relatively defect free, and they have excellent adhesive properties. In addition, when the metallic filler is a magnetic material, the coatings herein are magnetized by magnetic fields (having net magnetic moments). As such, they are particularly useful in the production of magnetic recording media. For instance, the coatings can be used on magnetic heads, discs, tapes and the like. Similarly, when the metallic filler is electrically conductive, the coatings herein are electrically conductive. As such, they are particularly useful for a variety of electronic applications such as in the manufacture of integrated circuits. Finally, the metal containing ceramic coatings are thermally conductive such that they can be used in applications such as heat sinks which require heat dissipation.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of an organosilicon precursor. One example of such a process is described in U.S. Pat. No. 5,011,706 which is incorporated herein by reference. A second example involves the chemical vapor deposition utilizing trimethylsilane as the source gas.

The following non-limiting examples are included so that one skilled in the art may more readily understand the invention.

EXAMPLE 1

Eccospheres™ DCT-28-27 (silica glass microballoons with a particle size range of 10–40 micrometers, 0.2 g, were ground in a mortar and pestle for about 20 minutes to decrease the particle size. A coating composition was then formed by mixing the ground glass, 0.7 g of Hydrogen silsesquioxane resin made by the method of Collins et al. in U.S. Pat. No. 3,615,273, and 0.012 g glycidoxypropyltrimethoxysilane and 0.36 g dodecane. The coating composition was applied to the surface of 2–7.6×12.7 cm aluminum panels; one using a 75 micrometer applicator to apply a 50 micrometer coating and the second using a 100 micrometer applicator to apply a 75 micrometer coating. The coatings were allowed to dry for 1 hour at 64° C. The coated panels were then heated at 185° C. for 1 hour and at 410° C. for 45 minutes. The dielectric constant and dissipation factor for the 75 micrometer coating are as follows:

| Frequency | Dielectric Constant | Dissipation Factor |
| --- | --- | --- |
| 100 HZ | 2.43 | 0.106 |
| 1 KHZ | 2.21 | 0.097 |
| 10 KHZ | 2.13 | 0.019 |
| 100 KHZ | 2.08 | 0.009 |

The spheres had a dielectric constant=1.17 (1–8.6 GHZ) and dissipation factor=0.001 (1–8.6 GHZ).

EXAMPLE 2

A coating composition was formed by mixing 0.12 g Eccospheres SDT-28-27 (not crushed), 0.12 g 5 micrometer Minusil (silica), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of various substrates and processed as set out in the following table:

| Substrate | Film Applicator | Air Dry | 185° C. | 410° C. | Thickness (micron) |
| --- | --- | --- | --- | --- | --- |
| 7.5 × 15 cm Al Panel | 75 um | 3 hr | 1.75 hr | 1.25 hr | 20 |
| 7.5 × 15 Al Panel | 100 um | 3 hr | 1.75 hr | 1.25 hr | 41 |
| 7.5 × 15 Al Panel | 125 um | 3 hr | 1.75 hr | 1.25 hr | 48 |
| 7.5 cm Si Wafer | 75 um | 3 hr | 0.75 hr | 1.00 hr | 24 |
| 5 cm sq 10,000 A | 75 um | 3 hr | 0.75 hr | 1.00 hr | 22 |

-continued

| Substrate | Film Applicator | Air Dry | 185° C. | 410° C. | Thickness (micron) |
|---|---|---|---|---|---|
| gold on nichrome 5 cm sq wafer-Al coated | 150 um | 3 hr | 0.75 hr | 1.00 hr | 42 |
| Al interdigitated pattern on 5 cm Si wafer | 150 um | 3 hr | 0.75 hr | 1.00 hr | 22 |

The aluminum interdigitated pattern on the silicon wafer coated above was tested for porosity, pinhole density, and barrier layer ability by MIL STD 883C, Method 2021-3, Procedure B, for determining glassivation layer integrity with a phosphoric acid etch solution. The etch solution consists of 16 parts conc. phosphoric acid, 2 parts deionized water, 1 part concentrated nitric acid and 1 part glacial acetic acid. The sample was tested by applying 1 drop of the etch solution on the surface of the coating for a period of 50 minutes (30 minutes=normal exposure time). The sample was next rinsed with distilled water and allowed to dry. Examination of the test area on the coating showed the film was intact and there was no evidence of any corrosion. The dielectric constant and dissipation factor for the 7.5×15 cm aluminum panel coated above with the 41 micrometer thick coating are as follows:

| Freguency | Dielectric Constant | Dissipation Factor |
|---|---|---|
| 100 HZ | 2.42 | 0.032 |
| 1 KHZ | 2.35 | 0.014 |
| 10 KHZ | 2.32 | 0.006 |
| 100 KHZ | 2.31 | 0.004 |

EXAMPLE 3

A coating composition was formed by mixing 0.12 g Eccospheres SDT-28-27 (not crushed), 0.12 g plasma alumina, average particle size=6 micrometers (Product No. 13,699, ZYP Coatings, Inc.), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of a 7.5×12.5 cm aluminum panel using a 75 micrometer applicator. The coatings were allowed to dry for 3 hours at 64° C. The coated panels were then heated at 185° C. for 1 hour and at 400° C. for 1 hour. A 31 micrometer thick coating was obtained. The dielectric constant and dissipation factor for the coating are as follows:

| Freguency | Dielectric Constant | Dissipation Factor |
|---|---|---|
| 100 HZ | 2.04 | 0.058 |
| 1 KHZ | 1.94 | 0.030 |
| 10 KHZ | 1.87 | 0.020 |
| 100 KHZ | 1.82 | 0.015 |

EXAMPLE 4

A coating composition was formed by mixing 0.15 g plasma alumina, average particle size=6 micrometers (Product No. 13,699 ZYP Coatings, Inc.), 0.7 g of Hydrogen silsesquioxane resin made by the method of Collins et al. in U.S. Pat. No. 3,615,273, 0.024 g glycidoxypropyltrimethoxysilane and 0.271 g dodecane. The coating composition was applied to the surface of a 7.5×12.5 cm aluminum panel using a 50 micrometer applicator. The coatings were allowed to dry for 4 hours at 64° C. The coated panels were then heated at 185° C. for 1 hour and at 400° C. for 1 hour. A 36 micrometer thick coating was obtained. The dielectric constant and dissipation factor for the coating are as follows:

| Frequency | Dielectric Constant | Dissipation Factor |
|---|---|---|
| 100 HZ | 2.23 | 0.038 |
| 1 KHZ | 2.15 | 0.017 |
| 10 KHZ | 2.12 | 0.008 |
| 100 KHZ | 2.10 | 0.005 |

EXAMPLE 5

Nalco 84SS-258 (30 % colloidal silica with a particle size of 20 nanometer diluted in a glycol propyl ether), 1.08 g, 0.6 g of Hydrogen silsesquioxane resin made by the method of Collins et al. in U.S. Pat. No. 3,615,273, and 1.08 g 2-(2-butoxyethoxy)ethyl acetate were mixed in 1.11 g methyl ethyl ketone. The coating composition was applied to the surface of 10 Motorola 14011B CMOS devices and spun at 3000 RPM for 10 seconds. A 2.5 cm square silicon wafer was also coated in the same manner. The coated materials were then heated at 400° C. for 2.5 hours in air. The CMOS devices were all functional after pyrolysis. Salt atmosphere tests per MIL-STD-883C, method 1009 showed that 7 out of 10 passed 2 hours and 3 of 7 passed 4 hours in the test. A similar coating of silica derived from H-resin failed after 10 minutes in the test.

EXAMPLE 6

Nalco 84SS-258 (30 % colloidal silica with a particle size of 20 nanometer diluted in a glycol propyl ether), 2.163 g, 2.0 g of triethoxysilane, 0.164 g water, 9.49 g isopropyl alcohol and 3.0 g n-butanol were mixed and heated at 60°–75° C. for 30 minutes. The coating composition was applied to the surface of 2.5×7.5 cm aluminum panel. The coated panel was air dried for 10 minutes and pyrolyzed at 400° C. for 1 hour in air. A Motorola 14011B CMOS device and a 2.5 cm square silicon wafer were also spin coated with the above liquid mixture at 3000 RPM for 15 seconds. The coated parts were then heated at 400° C. for 4 hours in air. FTIR showed essentially complete conversion to silica. The CMOS device was functional after pyrolysis and survived 4 hrs of the salt atmosphere tests of Example 5 (failed at 24 hrs).

EXAMPLE 7

A coating composition was formed by mixing 3 g of $Fe_2O_3$ powder (0.27 micrometer size from Hatcross Pigments Inc), 1 g of Hydrogen silsesquioxane resin made by the method of Collins et al. in U.S. Pat. No. 3,615,273, 0.4 g glycidoxypropyltrimethoxysilane and 3.5 g of cyclic polydimethylsiloxanes. A sonic probe was used for 30 seconds to completely disperse the materials. The coating composition was applied to the surface of a 29 square centimeter aluminum panel using a 50.8 micrometer drawdown bar. The coating was allowed to dry for 3 hours 30 minutes. The coated panel was then heated at 400° C. for 1 hour in air. A 14.9 micrometer thick crack free coating was obtained. The coating was tested for magnetic response by placing the coated panel on a balance and moving a permanent magnet above the coating. A magnetic response was obtained as the magnetic materials repelled each other.

EXAMPLE 8

A coating composition was formed by mixing 4 g of CuZn powder (from D.M. Steward), 1 g of Hydrogen silsesquioxane resin made by the method of Collins et al. in U.S. Pat. No. 3,615,273, 0.4 g glycidoxypropyltrimethoxysilane and 1.5 g of cyclic polydimethylsiloxanes. A sonic probe was used for 20 seconds to completely disperse the materials. The coating composition was applied to the surface of a 29 square centimeter aluminum panel using a 50.8 micrometer drawdown bar. The coating was allowed to dry for 3 hours 15 minutes. The coated panel was then heated at 400° C. for 1 hour in air. A 23.2 micrometer thick crack free coating was obtained. The coating was tested for magnetic response by placing the coated panel on a balance and moving a permanent magnet above the coating. A magnetic response was obtained as the magnetic materials repelled each other.

EXAMPLE 9

A coating composition was formed by mixing 4 g of NiZn powder (CB-100 from D.M. Steward), 1 g of Hydrogen silsesquioxane resin made by the method of Collins et al. in U.S. Pat. No. 3,615,273, 0.4 g glycidoxypropyltrimethoxysilane and 1.5 g of cyclic polydimethylsiloxanes. A sonic probe was used to completely disperse the materials. The coating composition was applied to the surface of a 29 square centimeter aluminum panel using a 50.8 micrometer drawdown bar. The coating was allowed to dry for 3 hours 25 minutes. The coated panel was then heated at 400° C. for 1 hour in air. A 22.7 micrometer thick crack free coating was obtained. The coating was tested for magnetic response by placing the coated panel on a balance and moving a permanent magnet above the coating. A magnetic response was obtained as the magnetic materials repelled each other.

EXAMPLE 10

A coating composition was formed by mixing 3 g of MnZn powder (from D.M. Steward), 1 g of Hydrogen silsesquioxane resin made by the method of Collins et al. in U.S. Pat. No. 3,615,273, 0.4 g glycidoxypropyltrimethoxysilane and 1.5 g of cyclic polydimethylsiloxanes. A sonic probe was used for 17 seconds to completely disperse the materials. The coating composition was applied to the surface of a 29 square centimeter aluminum panel using a 50.8 micrometer drawdown bar. The coating was allowed to dry for 25 minutes. The coated panel was then heated at 400° C. for 1 hour in air. A 22.6 micrometer thick crack free coating was obtained. The coating was tested for magnetic response by placing the coated panel on a balance and moving a permanent magnet above the coating. A magnetic response was obtained as the magnetic materials repelled each other.

EXAMPLE 11

A coating composition was formed by mixing 9 g of zinc powder (5 micrometer size from Cerac), 1 g of Hydrogen silsesquioxane resin made by the method of Collins et al. in U.S. Pat. No. 3,615,273, 0.4 g glycidoxypropyltrimethoxysilane and 1 g of cyclic polydimethylsiloxanes. A sonic probe was used for 30 seconds to completely disperse the materials. The coating composition was applied to the surface of a 29 square centimeter aluminum panel using a 50.8 micrometer drawdown bar. The coating was allowed to dry for 4 hours. The coated panel was then heated at 400° C. for 1 hour in air. A 40.6 micrometer thick crack free coating was obtained. The coating showed slight conductivity.

EXAMPLE 12

A coating composition was formed by mixing 6 g of silver powder (1 micrometer size from Cerac), 1 g of Hydrogen silsesquioxane resin made by the method of Collins et al. in U.S. Pat. No. 3,615,273, 0.4 g glycidoxypropyltrimethoxysilane and 2.5 g of cyclic polydimethylsiloxanes. A sonic probe was used for 23 seconds to completely disperse the materials. The coating composition was applied to the surface of a 29 square centimeter aluminum panel using a 50.8 micrometer drawdown bar. The coating was allowed to dry for 1.5 hours. The coated panel was then heated at 400° C. for 2 hour in air. A 16.5 micrometer thick crack free coating was obtained. The coating showed good electrical conductivity.

EXAMPLE 13

A coating composition was formed by mixing 4 g of nickel powder (5 micrometer size from Cerac), 1 g of Hydrogen silsesquioxane resin made by the method of Collins et al. in U.S. Pat. No. 3,615,273, 0.4 g glycidoxypropyltrimethoxysilane and 3.5 g of cyclic polydimethylsiloxanes. A sonic probe was used for 20 seconds to completely disperse the materials. The coating composition was applied to the surface of a 29 square centimeter aluminum panel using a 76.2 micrometer drawdown bar. The coating was allowed to dry for 3 hours. The coated panel was then heated at 400° C. for 1 hour in air. A 47 micrometer thick crack free coating was obtained. The coating showed good electrical conductivity.

EXAMPLE 14

A coating composition was formed by mixing 4 g of cobalt powder (3 micrometer size from Cerac), 1 g of Hydrogen silsesquioxane resin made by the method of Collins et al. in U.S. Pat. No. 3,615,273, 0.4 g glycidoxypropyltrimethoxysilane and 2.5 g of cyclic polydimethylsiloxanes. A sonic probe was used for 20 seconds to completely disperse the materials. The coating composition was applied to the surface of a 29 square centimeter aluminum panel using a 76.2 micrometer drawdown bar. The coating was allowed to dry for 3 hours. The coated panel was then heated at 400° C. for 1 hour in air. A 36.7 micrometer thick crack free coating was obtained. The coating showed no electrical conductivity.

EXAMPLE 15

A coating composition was formed by mixing 4 g of aluminum powder (5 micrometer size from Cerac), 1 g of Hydrogen silsesquioxane resin made by the method of Collins et al. in U.S. Pat. No. 3,615,273, 0.4 g glycidoxypropyltrimethoxysilane and 1.5 g of cyclic polydimethylsiloxanes. A sonic probe was used for 20 seconds to completely disperse the materials. The coating composition was applied to the surface of a 5.7×11.4 centimeter aluminum panel using a 50.8 micrometer drawdown bar. The coating was allowed to dry for 3 hours. The coated panel was then heated at 600° C. for 1 hour in argon. A 23.9 micrometer thick crack free coating was obtained. The coating showed good electrical conductivity.

EXAMPLE 16

A coating composition was formed by mixing 8 g of chromium powder (10 micrometer size from Cerac), 1 g of Hydrogen silsesquioxane resin made by the method of Collins et al. in U.S. Pat. No. 3,615,273, 0.4 g glycidoxypropyltrimethoxysilane and 1.0 g of cyclic polydimethylsiloxanes. A sonic probe was used for 20 seconds to completely disperse the materials. The coating composition was applied to the surface of a 5.7×11.4 centimeter aluminum panel using a 50.8 micrometer drawdown bar. The coating was allowed to dry for 2 hours. The coated panel was then heated at 600° C. for 1 hour in argon. A 34.1 micrometer thick crack free coating was obtained. The coating showed no electrical conductivity.

What is claimed is:

1. A method of forming a metal containing ceramic coating on a substrate comprising:

applying a coating composition comprising hydrogen silsesquioxane resin and a finely divided elemental metal or metal alloy solid phase distributed within the resin onto a substrate; and heating the coating composition on the substrate to convert it into a ceramic coating containing the finely divided elemental metal or metal alloy solid phase distributed within the ceramic.

2. The method of claim 1 wherein the coating composition is applied to the substrate by a process which comprises coating the substrate with a liquid mixture comprising a solvent, the hydrogen silsesquioxane resin and the finely divided elemental metal or metal alloy solid phase distributed within the resin and then evaporating the solvent.

3. The method of claim 1 wherein the coating composition is heated at a temperature in the range of between about 50° C. and about 800° C. for less than about 3 hours.

4. The method of claim 1 wherein the coating composition also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy and acyloxy and the compound is present in an amount such that the coating contains 0.1 to 30 percent by weight modifying ceramic oxide.

5. The method of claim 1 wherein the coating composition also contains a platinum, rhodium or copper catalyst in an amount of between about 5 and about 500 ppm platinum, rhodium or copper based on the weight of hydrogen silsesquioxane resin.

6. The method of claim 1 wherein the coating composition also contains a material which modifies the surface of the finely divided elemental metal or metal alloy solid phase for adhesion.

7. The method of claim 1 wherein the finely divided elemental metal or metal alloy solid phase is in a form selected from the group consisting of powders, filaments, particles, and flakes.

8. The method of claim 1 wherein the finely divided elemental metal or metal alloy solid phase is present in the coating composition in an amount in the range of about 5 to about 80 weight percent.

9. The method of claim 1 wherein the finely divided elemental metal or metal alloy solid phase is selected from the group consisting of gold, silver, copper, aluminum, nickel, zinc, chromium, and cobalt.

10. The substrate coated by the method of claim 1.

11. A coating composition comprising hydrogen silsesquioxane resin and a finely divided elemental metal or metal alloy solid phase dispersed in a solvent.

12. The composition of claim 11 which also contains a material which modifies the surface of the finely divided elemental metal or metal alloy solid phase for adhesion.

13. The composition of claim 11 wherein the finely divided elemental metal or metal alloy solid phase is selected from the group consisting of gold, silver, copper, aluminum, nickel, zinc, chromium, and cobalt.

14. A method of forming a magnetic ceramic coating on a substrate comprising:

applying a coating composition comprising hydrogen silsesquioxane resin and a finely divided magnetic solid phase selected from the group consisting of ferrites, iron carbonyls metal alloys distributed within the resin onto a substrate; and heating the coating composition on the substrate to convert it into a ceramic coating containing the finely divided magnetic solid phase distributed within the ceramic.

15. The method of claim 14 wherein the metal alloy contains at least 2 elemental metals selected from the group consisting of iron, manganese, cobalt, nickel, copper, titanium, tungsten, vanadium, molybdenum, magnesium, aluminum, chromium, zirconium, lead, silicon and zinc.

16. The method of claim 14 wherein the metal alloy is selected from the group consisting of MnZn, NiZn and CuZn.

17. A coating composition comprising hydrogen silsesquioxane resin and a finely divided magnetic solid phase selected from the group consisting of ferrites, iron carbonyls and metal alloys dispersed in a solvent.

18. The method of claim 14 wherein the metal alloy contains carbon.

19. The coating composition of claim 17 wherein the metal alloy contains carbon.

* * * * *